(12) United States Patent
Ozaki et al.

(10) Patent No.: US 8,443,484 B2
(45) Date of Patent: May 21, 2013

(54) SUBSTRATE PROCESSING APPARATUS (75) Inventors: Yukio Ozaki, Toyama (JP); Teruo Yoshino, Kanazawa (JP); Satoru Takahata, Imizu (JP); Reizo Nunozawa, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1223 days.

(21) Appl. No.: 12/222,653

(22) Filed: Aug. 13, 2008

(65) Prior Publication Data

US 2009/0044749 A1 Feb. 19, 2009

(30) Foreign Application Priority Data

Aug. 14, 2007 (JP) ................................. 2007-211497
Apr. 22, 2008 (JP) ................................. 2008-111680

(51) Int. Cl.
*A47L 5/38* (2006.01)
(52) U.S. Cl.
USPC ............................... 15/303; 15/319; 15/306.1
(58) Field of Classification Search
USPC ................................. 15/319, 339, 303, 306.1
IPC .......................................................... A47L 5/38
See application file for complete search history.

(56) References Cited

U.S. PATENT DOCUMENTS

2008/0105204 A1  5/2008  Nakada et al.

FOREIGN PATENT DOCUMENTS

| JP | A-6-177066 | 6/1994 |
|---|---|---|
| JP | A-6-338468 | 12/1994 |
| JP | A-07-161656 | 6/1995 |
| JP | A-09-045597 | 2/1997 |
| JP | A-2001-345279 | 12/2001 |
| JP | A-2002-43398 | 2/2002 |
| JP | A-2002-191901 | 7/2002 |
| JP | A-2004-119888 | 4/2004 |
| JP | A-2005-85784 | 3/2005 |
| JP | A-2007-95879 | 4/2007 |
| JP | A-2007-095879 | 4/2007 |
| JP | A-2007-273530 | 10/2007 |

OTHER PUBLICATIONS

Translated Japanese Office Action issued in Japanese Patent Application No. 2008-111680; mailed on Sep. 30, 2009.
Japanese Office Action issued in Japanese Patent Application No. 2008-111680 on Feb. 16, 2010.
Korean Office Action dated Dec. 22, 2010 in corresponding Korean Patent Application No. 9-5-2010-047481315 (with translation).
Sep. 5, 2012 Office Action issued in Japanese Patent Application No. 2009-275907 (with English translation).

*Primary Examiner* — David Redding
(74) *Attorney, Agent, or Firm* — Oliff & Berridge, PLC (57) ABSTRACT To automatically purge a transfer chamber by means of inert gas. There is provided a substrate processing apparatus including a controller that performs control so that a transfer chamber 102 connected to a processing chamber 202 for processing a substrate is purged by gas, the controller having a switching unit that switches a function of exhausting the gas in the transfer chamber 102 in a set direction, and a function of circulating the gas through the transfer chamber 102 in an inert gas atmosphere.

9 Claims, 6 Drawing Sheets

(A) N₂ PURGE MODE (B) 1 PASS MODE

(A) ONE PASS FIXING DEVICE

|  | LOAD | UNLOAD |
|---|---|---|
| 1 PASS S/W | OFF | ON |
| AV65 (DV1) | CLOSE | OPEN |
| AV66 (DV2) | CLOSE | OPEN |
| AV56 (LA1) | OPEN | OPEN |
| OV1 | EFFECTIVE | INEFFECTIVE |

(B) $N_2$ PURGE DEVICE

|  | LOAD | UNLOAD |
|---|---|---|
| 1 PASS S/W | OFF | OFF |
| AV65 (DV1) | CLOSE | CLOSE |
| AV66 (DV2) | CLOSE | CLOSE |
| AV56 (LA1) | OPEN | OPEN |
| OV1 | EFFECTIVE | EFFECTIVE |

OPEN FURNACE DEVICE EXCLUDING N₂ PURGE

|  | LOAD | UNLOAD |
|---|---|---|
| 1 PASS S/W | ON | ON |
| AV65 (DV1) | OPEN | OPEN |
| AV66 (DV2) | OPEN | OPEN |
| AV56 (LA1) | OPEN | OPEN |
| OV1 | INEFFECTIVE | INEFFECTIVE | ic matter is adhered thereto in some instances. It is
SUBSTRATE PROCESSING APPARATUS

BACKGROUND

1. Technical Field

The present invention relates to a substrate processing apparatus that processes a substrate in a processing chamber, and particularly relates to the substrate processing apparatus, with a transfer chamber connected to the processing chamber.

2. Background Art

In the substrate processing apparatus, with the processing chamber and the transfer chamber being connected to each other, in order to prevent a natural oxidization of a substrate, the transfer chamber is set in an air-tightly closed structure, and an inside of the transfer chamber is replaced with inert gas and there are provided a purge gas inlet tube and an exhaust tube for maintaining an oxygen concentration to a prescribed value or less.

In order to prevent adhesion of a natural oxide film on the substrate, the oxygen concentration is maintained to a prescribed value or less and the inert gas is circulated in the transfer chamber.

However, when a surface of the substrate is examined after processing the substrate in the processing chamber, an organic matter is adhered thereto in some instances. It is found that such an organic matter is generated by heating wiring of the processing chamber at the time of high temperature processing, and by diffusion of the organic matter into the transfer chamber together with a high temperature atmosphere at the time of unloading the wafer, such an organic matter is adhered to the substrate. When the film is deposited without cleaning the organic matter, a film grows from a part to which a contaminated substance such as an organic matter, etc, is adhered. Therefore, a local distortion of crystal lattice and non-uniformity of an in-surface film thickness are generated in that case.

However, in order to change so as to prevent the adhesion of the organic matter to the substrate, rather than preventing the adhesion of the natural oxide film to the substrate, an apparatus structure and an apparatus parameter must be changed. Accordingly, since a location of the apparatus is limited, the apparatus must be operated so that a function of preventing the adhesion of the natural oxide film to the substrate by the same apparatus and the function of preventing the adhesion of the organic matter onto the substrate are switched for each processing.

SUMMARY OF THE INVENTION

Therefore, an object of the present invention is to provide the substrate processing apparatus capable of switching from the apparatus for preventing the adhesion of the natural oxide film to the substrate, so that the apparatus is operated to immediately exhaust the organic matter diffusing in the transfer chamber from the transfer chamber, before this organic matter is adhered to the substrate, or allowing also the opposite operation to be performed by one apparatus.

In order to achieve the above-described object, the present invention provides the substrate processing apparatus including a controller that controls so as to purge the transfer chamber connected to the processing chamber for processing the substrate, with the controller having a switching unit for switching a function of exhausting a gas flow in the transfer chamber in a set direction and a function of circulating the gas in the transfer chamber under atmosphere of inert gas. When the inert gas in the transfer chamber is exhausted in a set direction before/after unloading the wafer and during unloading, the organic matter diffused in the transfer chamber is immediately exhausted from the transfer chamber. Since the organic matter is exhausted, the adhesion of the organic matter to the surface of the substrates is prevented.

According to the present invention, even when it is necessary to prevent the adhesion of the organic matter rather than preventing the adhesion of an oxide film onto the substrate in the transfer chamber, the adhesion of the organic matter can be prevented by operating the same apparatus in such a manner as switching the function of preventing the adhesion of a natural oxide film to the substrate and the function of preventing the adhesion of the organic matter on the substrate. Also, even when an apparatus structure and an apparatus parameter are changed, it is not necessary to change a program. Therefore, it becomes possible to efficiently perform a work of switching the function of preventing the adhesion of the natural oxide film and the function of preventing the adhesion of the organic matter on the substrate. As a result, it becomes possible to efficiently perform the operation of switching the function of preventing the adhesion of the natural oxide film to the substrate, to the function of preventing the adhesion of the organic matter on the substrate during unloading according to a film kind.

BEST MODE FOR CARRYING OUT THE INVENTION

A substrate processing apparatus according to an embodiment of the present invention will be explained, with reference to FIG. 1 and FIG. 2, and next a substrate processing system and a substrate processing method according to the present invention will be explained with reference to FIG. 3 to FIG. 7.

Figure 1:
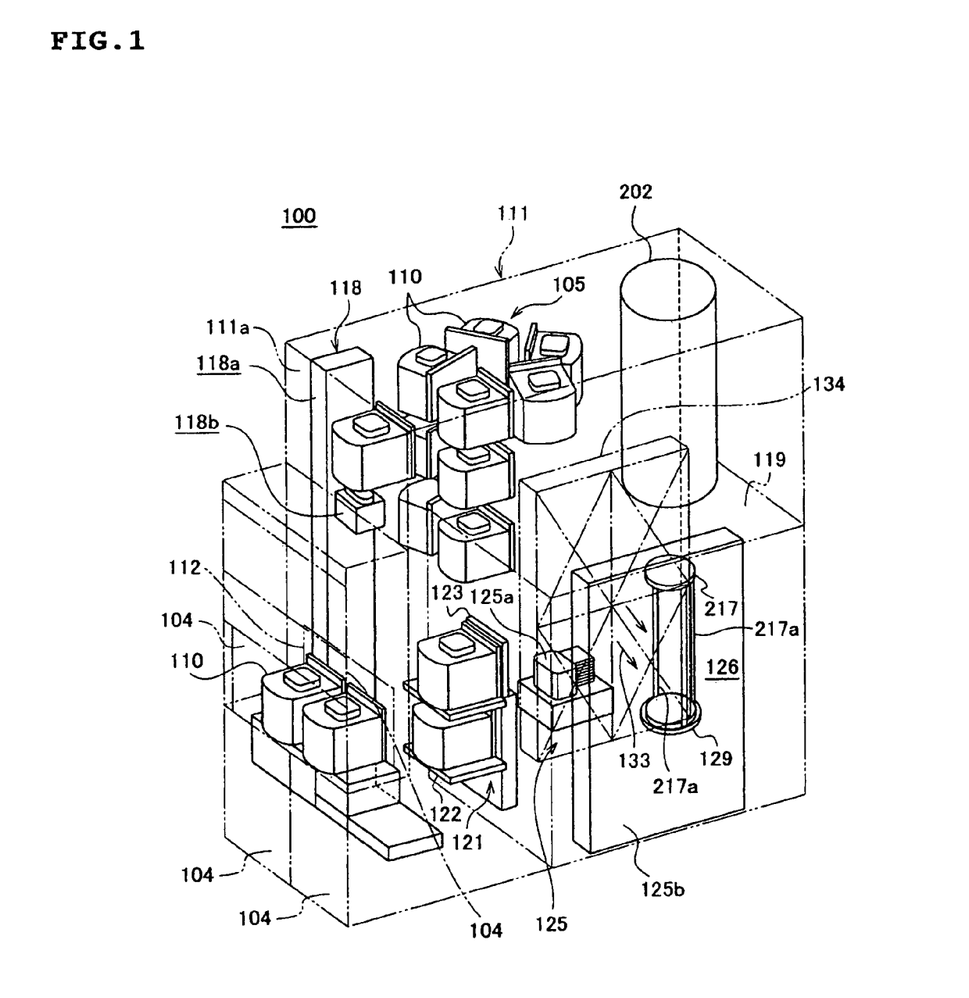
FIG. 1 is a front view of a substrate processing apparatus according to an embodiment of the present invention.
Figure 2:
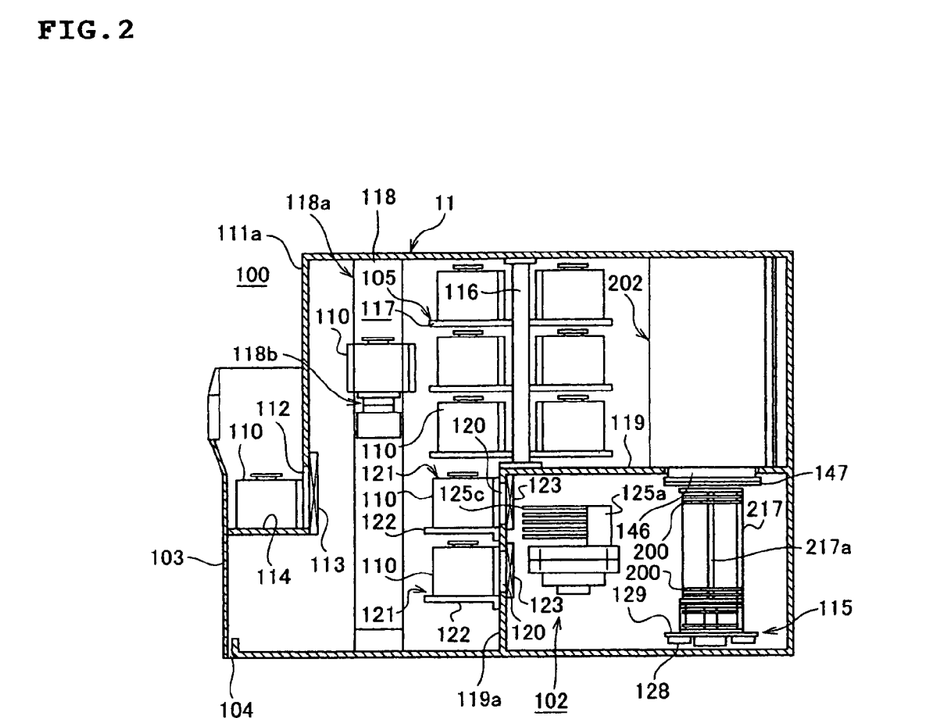
FIG. 2 is a side view of FIG. 1.

FIG. 1 is a front side view of the substrate processing apparatus, and FIG. 2 is a side view of FIG. 1.

As shown in FIG. 1 and FIG. 2, in a substrate processing apparatus 100 according to this embodiment, a hoop (substrate container, referred to as a pod) 110 is used as a wafer carrier in which wafers 200 (processed substrate) composed of silicon, etc, are contained. At present, a type of FOUP is mainly used as a pod 110. The wafers 200 are transported in a state of being separated from atmospheric air by closing an opening part formed on one side surface by a lid member (not shown), so that each wafer 200 can be charged/discharged into and from the pod 110 by removing the lid member.

A pod loading/unloading port (loading/unloading port of the substrate container) 112 is opened on a front face wall 111a of a casing 111 so as to communicate inside and outside of the casing 111, and the pod loading/unloading port 112 is opened/closed by a front shutter (opening/closing mechanism of a substrate container loading/unloading port) 113.

A load port (substrate container transfer table) 114 is set on the front side of a front face of the pod loading/unloading port 112.

The load port 114 is constituted so as to place and align the pod 110.

The pod 110 is unloaded onto the load port 114 by an in-step transport device (not shown), and is unloaded from the load port 114.

A rotary pod rack (substrate container placement rack) 105 is set in an upper part in approximately a longitudinal center in the casing 111, and the rotary pod rack 105 is constituted to store a plurality of pods 110. Namely, the rotary pod rack 105 includes a supporting strut 116 vertically erected and intermittently rotated in a horizontal surface, and a plurality of rack boards (substrate container placement tables) 117 radially supported at each position of upper, middle, and lower stages of the supporting strut 116, with the plurality of rack boards 117 being held in a state of placing the plurality of pods 110 thereon respectively.

In the casing 111, a pod transport device (substrate container transport device) 118 is set between the load port 114 and the rotary pod rack 105.

The pod transport device 118 is constituted of a pod elevator (substrate container elevation mechanism) 118a capable of elevating the pod 110, with the pod 110 held therein, and a pod transport mechanism (substrate container transport mechanism) 118b as a transport mechanism, so that the pod transport device 118 transports the pod 110 among the load port 114, the rotary pod rack 105, the pod opener (opening/closing mechanism of the substrate container) 121.

In a lower part of approximately a longitudinal center part in the casing 111, a sub-casing 119 is constructed so as to extend to a rear end.

A pair of wafer loading/unloading ports (substrate loading/unloading ports) 120 for loading/unloading the wafer 200 into/from the sub-casing 119 are opened on a front face wall 119a of the sub-casing 119, so as to be arranged side by side in upper and lower two stages in a vertical direction, and a pair of pod openers 121, 121 are respectively set in the wafer loading/unloading ports 120 and 120 of upper and lower stages.

The pod opener 121 includes placement tables 122, 122 for placing the pod 110 thereon, and cap attachment/detachment mechanism (lid member attachment/detachment mechanism) 123, 123 for attaching/detaching a cap (lid member) of the pod 110.

The pod opener 121 is constituted to open/close the wafer charging/discharging port of the pod 110, by attaching/detaching the cap of the pod 110 placed on the placement table 122.

The sub-casing 119 constitutes a transfer chamber 102 fluidically separated from a space of setting the pod transport device 118 and the rotary pod rack 105. The transfer chamber (air-tightly closed chamber) 102 is used as a transport area of the wafer 200 and a loading and unloading space of a boat (substrate holder) 217 as will be described later.

<Transfer Chamber>

In order to prevent a natural oxidization of the wafer 200, the transfer chamber 102 is formed in an air-tightly closed vessel corresponding to a reduced pressure of the processing chamber 202, and filled with inert gas. Various gases can be used for the inert gas. However, in this embodiment, inexpensive $N_2$ gas is used.

A wafer transfer mechanism (substrate transfer mechanism) 125 is set in a front side region of the transfer chamber 102, and the wafer transfer mechanism 125 is constituted of a wafer transfer device (substrate transfer device) 125a capable of rotating and straightly moving the wafer 200 in a horizontal direction, and a wafer transfer device elevator (substrate transfer device elevation mechanism) 125b for elevating the wafer transfer device 125a.

As shown in FIG. 1, the wafer transfer device elevator 125b is installed between the right side end portion of a pressure-resistant casing 111 and the right end portion in a front region of the transfer chamber 102 of the sub-casing 119.

By continuous operation of the wafer transfer device elevator 125b and the wafer transfer device 125a, charge/discharge of the wafer 200 into/from the boat (substrate holding tool) is executed by a tweezer (substrate holder) 125c, with the tweezer (substrate holder) 125c of the wafer transfer device 125a set as a placement part of the wafer 200.

A standby part 126 for housing the boat 217 and making it standby is constituted in a rear side region of the transfer chamber 102.

A reactor 201 is provided in an upper part of the standby part 126, and a lower part of the reactor 201 is constituted so as to be opened and closed by a furnace port shutter (furnace port opening/closing mechanism) 147. The reaction chamber 202 is provided in the reactor 201. A partitioning wall of the processing chamber 202 is constituted of a dielectric material that can be electrically insulated, such as quartz (quartz glass, etc) and ceramics.

The processing chamber 202 is air-tightly partitioned by the partitioning wall made of dielectric materials and the seal cap 129, and a heater 13 is provided so as to surround the partitioning wall of the processing chamber 202.

Note that an exhaust tube (not shown) is communicated in the processing chamber 202, and a vacuum pump (not shown), being a pressure reducing exhaust device, is connected to the lower stream side of the exhaust tube. In addition, a gas inlet tube for introducing processing gas (such as film depositing source gas, oxide gas, and etching gas) is connected to the processing chamber 202.

As shown in FIG. 1, a boat elevator (substrate holding tool elevating mechanism) 115 for elevating the boat 217 is installed between the right side end portion of the casing 111 and the right end portion of the standby part 126.

The seal cap 129 is horizontally installed in an elevator arm 128, being a coupling tool, coupled to an elevation table of the boat elevator 115.

The seal cap 129 is constituted as a lid member vertically supporting the boat 217, to open/close the lower part of the reactor 201. This seal cap 129 is supported by the elevator arm 128 of the boat elevator 115. By this boat elevator 115, the elevator arm 128 is elevated and in a stage when the furnace port of the processing chamber 202 of the reactor 201 is closed by the seal cap 129, insertion of the boat 217 into the processing chamber 202 is ended. When the elevator arm 128 of the boat elevator 115 is lowered, the boat 217 is unloaded form the processing chamber 202.

An intake duct (described later) is provided on the side of the wafer transfer device elevator 125b and the left side end portion, being the opposite side to the boat elevator side in the transfer chamber 102, to supply clean air 133, being cleaned atmospheric air or inert gas, and a clean unit 134 constituted of a supply fan and a filter (not shown) is fitted to the intake duct (described later).

Then, a notch aligner (not shown) is installed between the wafer transfer device 125a and the clean unit 134, as a substrate aligner for aligning a position of the wafer 200 (substrate to be processed) in a circumferential direction.

The clean air 133 blown out from the clean unit 134 is circulated through the notch aligner and the wafer transfer device 125a, the boat 217 in the standby part 126, and is then sucked in an exhaust duct (described later) and blown out again into the transfer chamber 102 from the clean unit 134, and circulated through the transfer chamber 102.

As will be described later, a plurality of holding members 217c and 217d are provided in the boat 217.

Figure 3:
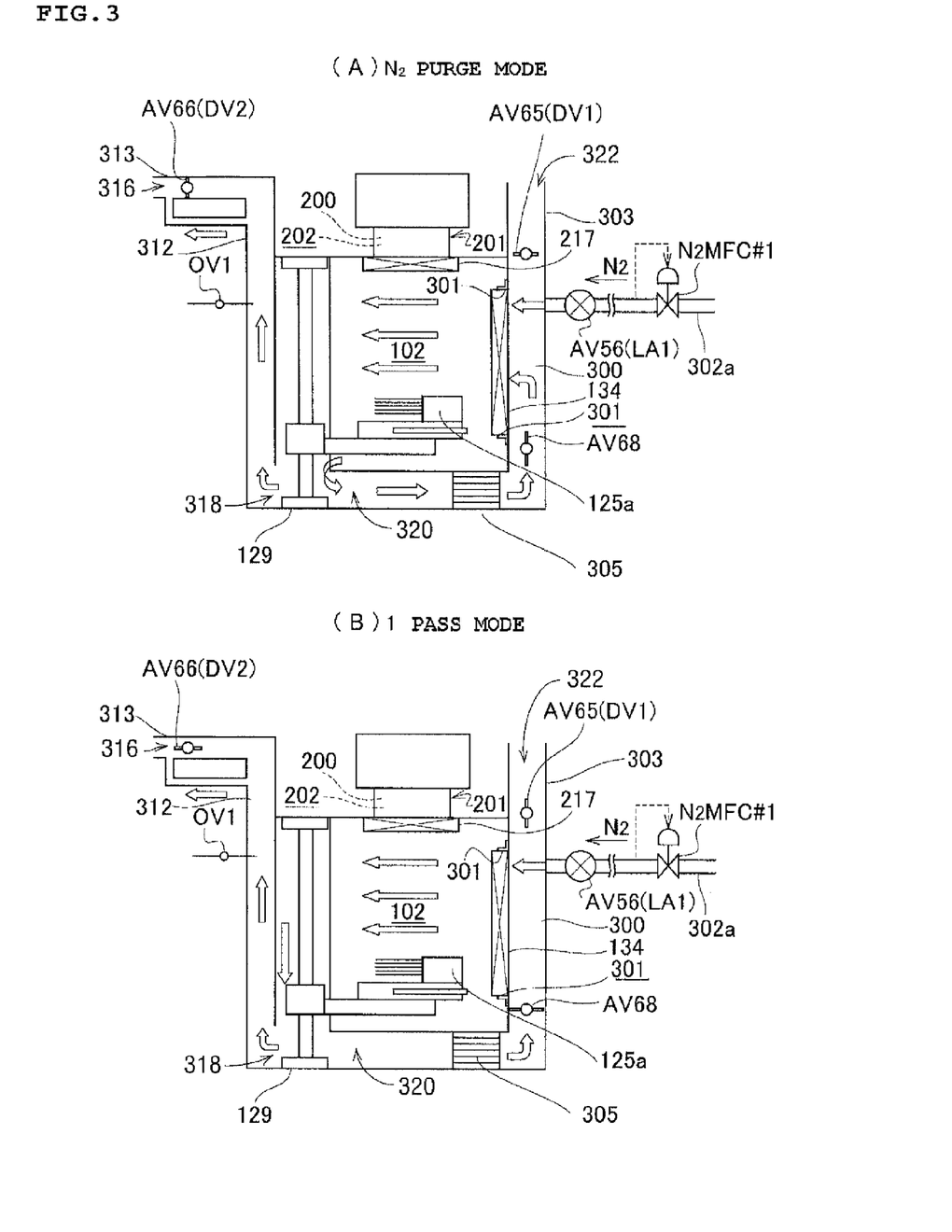
FIGS. 3A and 3B is an explanatory view showing a purge system and a circulation system of a transfer chamber according to an embodiment of the present invention.

FIG. 3 is an explanatory view showing an example of control to purge the transfer chamber 102 by a prescribed gas.

As shown in FIG. 3, an intake duct 300 is partitioned on the opposite side to the boat installment side, and an intake tube 303 is connected to an inlet port 322 of the intake duct 300. An exhaust port 320 of the intake duct 300 is opened in the vicinity of the bottom of the transfer chamber 102. Open/close valves AV65 and AV68 are provided respectively on its upper stream side and lower stream side, and a blow out port 301 is formed between the open/close valve 65 (DV1) on the upper stream side and the open/close valve AV68 on the lower stream side.

The clean unit 134 is fitted to the blow out port 301.

A system for purging the transfer chamber 102 is constituted of an exhaust duct 312 and a purge gas inlet tube 302a.

The purge gas inlet tube 302a is passed through a partitioning wall of the transfer chamber 102 from the opposite side to the side of the clean unit 134, to be inserted into the intake duct 300 and connected to the connection part of the rear side of the clean unit 134.

The gas exhaust port of the purge gas inlet tube 302a is opened in the vicinity of the furnace port of the processing chamber 202.

A mass flow controller N2MFC#1 is provided in each purge gas inlet tube 302a, for feedback-controlling the flow rate by a mass flow meter.

The inlet port 318 of the exhaust duct 312 is set on the opposite side to the boat 217 and the wafer transfer device 125a, and is opened in the vicinity of the bottom face of the transfer chamber 102.

The exhaust port 316 of the exhaust duct 312 is connected to a gas discharge tube 313 for exhausting a gas inside of the processing chamber 202 and already processed gas from the processing chamber 202.

Open/close valves AV56 (LA1) and AV66 (DV2) for opening and closing the valves are provided in the purge gas inlet tube 302a and the exhaust duct 312. In addition, an oximeter OV1 is provided in the exhaust duct 312.

When the inlet port 318 of the exhaust duct 312 is opened in the vicinity of the bottom face of the transfer chamber 102, the transfer chamber 102 can be exhausted smoothly. Similarly, when the inlet port 322 of the intake duct 300 is opened in the vicinity of a ceiling of the transfer chamber 102 and the exhaust port 320 of the intake duct 300 is opened in the vicinity of the bottom face of the transfer chamber 102, the inside of the transfer chamber 102 can be circulated smoothly.

In addition, when opening/closing of the open/close valves AV56, AV65, AV66, and AV68 are combined, the inside of the transfer chamber 102 can be switched to atmospheric air or inert gas atmosphere, and the inert gas can be circulated through the transfer chamber 102. Note that "305" indicates a radiator for adjusting a temperature in the transfer chamber.

<Introduction of Atmospheric Air>

In a case of introducing the atmospheric air, the open/close valve AV66 (DV2) of the exhaust duct 312 is closed, the open/close valve AV65 (DV1) of the intake duct 300, and the open/close valve AV68 of the intake duct 300 are opened, and the open/close valve AV56 (LA1) of the purge gas inlet tube 302a is closed.

Thus, the atmospheric air in a clean room is introduced, to set inside of the transfer chamber 102 in an atmospheric pressure, thus making it possible to transport the wafer 200 between the pod 110 and the wafer transfer device 125a.

<Purge>

In a case of purge, the open/close valve AV65 (DV1) of the intake duct 300 is closed, and the open/close valve AV56 (LA1) of the purge gas inlet tube 302a is opened, and the open/close valve AV66 (DV2) of the exhaust duct 312 is opened.

Thus, the inert gas is introduced into the transfer chamber 102, from an inert gas supply source, for example, form an inert gas supply cylinder, and the atmosphere of the transfer chamber 102 is discharged from the exhaust duct 312. Therefore, the inside of the transfer chamber 102 is replaced with an inert gas atmosphere, for example a nitrogen gas.

When the inside of the transfer chamber is replaced with the inert gas, an oxygen concentration is lowered and a natural oxidization of the wafer 200 in the transfer chamber 102 can be prevented.

<Circulation of the Atmosphere in the Transfer Chamber>

When the inert gas is circulated, the open/close valve AV56 (LA1) of the purge gas inlet tube 302a is opened, and the open/close valve AV68 of the intake duct 300 is opened, and the open/close valve AV65 (DV1) of the intake duct 300 is closed, to drive the supply fan of the clean unit 134. In addition, the open/close valve AV66 (DV2) of the exhaust duct 312 is closed.

The inside of the transfer chamber 102 is cleaned by the inert gas cleaned by the filter of the clean unit 134 while circulating through the transfer chamber 102, and therefore contamination of the wafer 200 due to dust can be suppressed.

Figure 4:
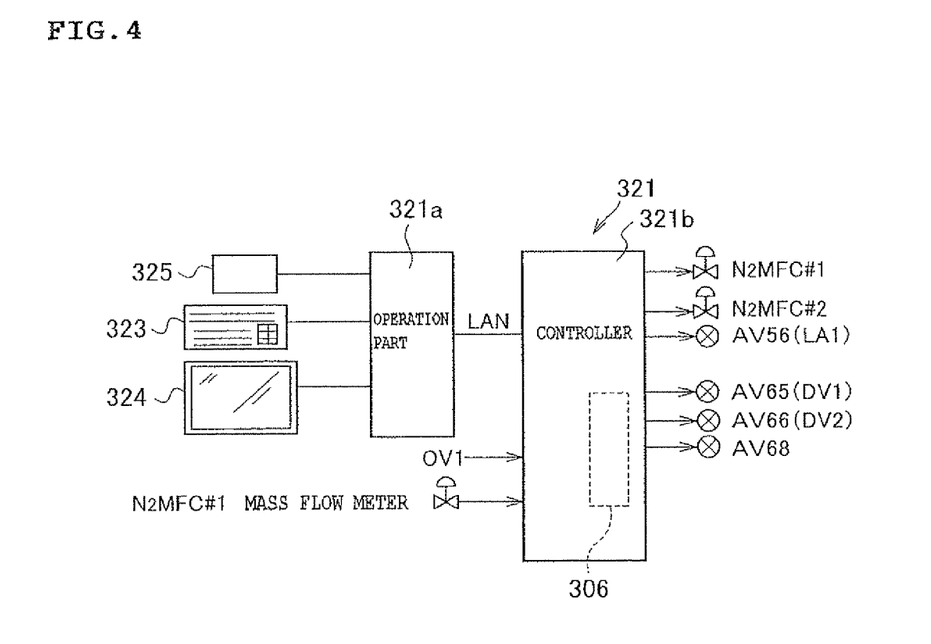
FIG. 4 is a block diagram showing an example of an apparatus controller according to an embodiment of the present invention.

FIG. 4 is a block diagram showing an example of an apparatus controller 321, being a controller, for executing substrate processing.

The apparatus controller 321 is constituted of a publicly-known computer mainly composed of a CPU, a memory, a hard disc, and I/O (all of them are not shown).

In this embodiment, the apparatus controller 321 is dispersed into an operating part 321a and a control part 321b, respectively, which are connected to each other via a LAN. However, the operating part and the control part may be constituted by single body.

A user interface, which is required, is connected to the operating part 321a, in addition to a monitor 324 (displayer).

A sub-controller, etc, is connected to an output part of the control part 321b, for operating the mass flow controller N2MFC#1 and the open/close valve AV68 of the intake duct 300, the open/close valve AV56 (LA1) of the purge gas inlet tube 302a, the open/close valve AV66 (DV2) of the exhaust duct 312, and the open/close valve AV65 (DV1) of the intake duct 300, and in addition a substrate transport system, an actuator of the substrate transport system, and each kind of mechanism with reference to a specific value.

In addition, a mass flow meter of the mass flow controller N2MEC#1 as will be described later and an oxygen concentration sensor OV1, etc, for detecting an oxygen concentration of the transfer chamber 102 are connected to an input part of the control part 321b.

In this embodiment, open/close valves AV56 (LA1), AV65 (DV1), AV66 (DV2), and AV68 are directly controlled by the apparatus controller 321, respectively. However, they may be controlled by a valve controller (not shown), being a kind of a sub-controller.

In addition, for example a hard disc 306 is mounted on the operating part 321a or the control part 321b as a fixed storage device. The hard disc 306 stores a configuration file, a process recipe for each film kind and a recipe for purging the transfer chamber 102 (called recipe generally hereunder), each kind of control table and each kind of parameter operation screen, and required data such as a screen file including a set screen.

When the apparatus controller 321 is started to execute the recipe, setting for each step constituting the recipe is referenced by a substrate transport system and the sub-controller of a substrate processing system, and the sub-controller of the substrate transport system controls the front shutter 113, pod transport device 118, rotary pod shelf, pod opener 121, cap attaching/detaching mechanism 123, wafer transfer device 125a, tweezer 125c, and notch aligner, and the sub-controller of the substrate processing system controls the furnace port shutter 147, boat elevator 115, heater, vacuum pump, and processing gas supply system.

Figure 6:
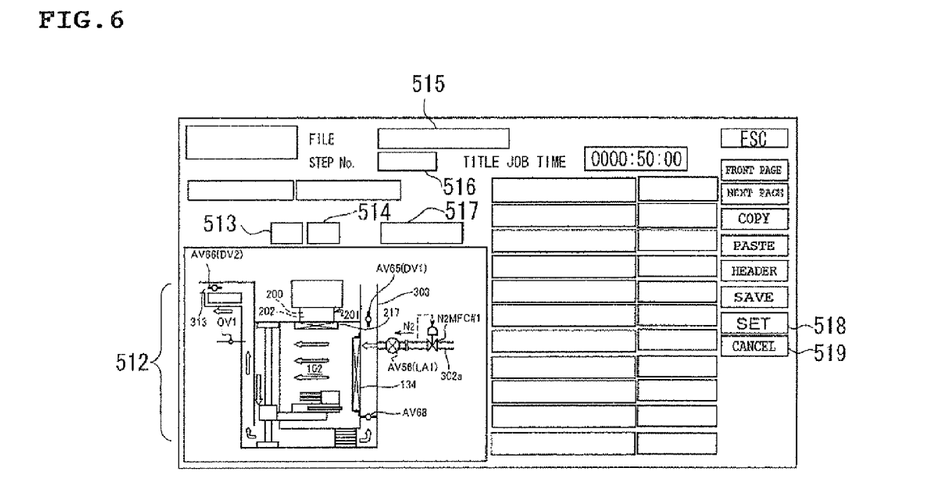
FIG. 6 is a view showing an example of an operation screen of the apparatus controller according to an embodiment of the present invention.

FIG. 6 shows an operation screen for preparing the recipe in the apparatus controller 321.

Note that this operation screen is an example of the recipe (called a purge recipe hereunder) for purging the transfer chamber 102, and the present invention is not limited by a layout and an item of the screen and an arrangement of the kind of a button.

As shown in FIG. 6, a valve arrangement view 512 is displayed in a lower left column of the screen, and set items are displayed in a right column of the screen and file information is displayed in an upper column of the screen. The structure of the valve arrangement view 512 corresponds to the structure explained in FIG. 3, and therefore explanation therefore is omitted here.

Two programs such as "NAME" button 513 and "No." button 514 are displayed in the upper column of the valve arrangement view 512.

When the "NAME" button 513 is pressed, display of the designation mark displayed in the valve arrangement view 512 is switched to the display of a component name, and when the "No." button is pressed, in an opposite way, the display of the component name is switched to the display of the designation mark. Therefore, an operator of the apparatus can grasp an arrangement of components in piping only by selecting and pressing the "NAME" button 513 and the "No." button 514. These buttons are related to programs executed by the control part 321b respectively, and when the button is pressed by an input device such as a finger or a touch pen, the corresponding program is operated.

As the file information, for example, a "file" name input cell 515 and a "step No." display cell 516 for displaying the "step No." of the recipe are displayed.

In this case, the "file" name input cell 515 is a cell for inputting a table name of this screen, and the "step No." display cell 516 is a cell for inputting the step number corresponding to the number of steps of the recipe. In input, character/numeric character/symbol table (all of them are not shown) for operating a character input system displayed on the same screen are used. Also, a keyboard connected to the operating part 321a may be used.

Figure 7:
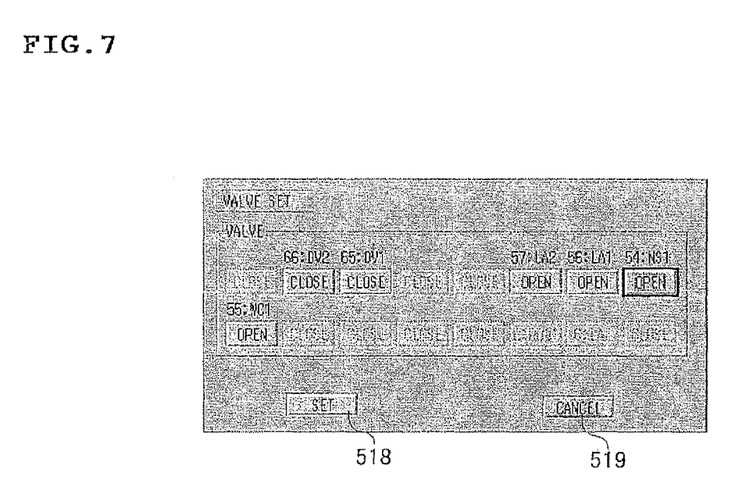
FIG. 7 is a view showing an example of a valve setting dialogue screen according to an embodiment of the present invention.

In addition, when the "valve setting" button 517, the set screen shown in FIG. 7 is displayed.

As shown in FIG. 7, a plurality of buttons are displayed on the valve setting screen.

The character/symbol display is displayed in an upper side of the button. The character and the symbol of the character/symbol display correspond to the designation mark of each open/close valve explained in FIG. 3.

Characters of OPEN and CLOSE on the button display opening/closing of each valve.

When these buttons are pressed, the characters of OPEN and CLOSE are switched from solid line display to broken line display, and when these buttons are pressed again, they are switched from the broken line display to the solid line display.

"66:DV2" on the screen corresponds to the open/close valve AV66, and "65:DV1" corresponds to AV65, AND "56: LA1" corresponds to AV56.

Accordingly, when the button just under the display of "66:DV2" is pressed, the character of CLOSE on the button is switched from the broken line display to the solid line display, and open/close valve of "66:DV2", namely, the open/close valve AV66 are set to be close.

When the button under the display of the same "66:DV2" is pressed, the character of CLOSE on the button is switched from the solid line display to the broken line display, and the open/close valve AV66 (DV2) corresponding to the display of "66:DV2" is set to be open. Note that in this case, it is possible to select a display form, in which the character is switched from OPEN to CLOSE by the same solid line display, or the character is switched reversely.

When open/close setting for the open/close valves AV56 (LA1), AV65 (DV1), AV66 (DV2), AV68 is finished, a "SET" button 518 in a lower part of this screen is pressed, to confirm the setting.

When the setting is canceled, a "CANCEL" button 519 displayed on the screen is pressed.

When the "SET" button 518 is pressed, the setting is reflected on the recipe, and when the recipe is executed, the open/close valves AV56 (LA1), AV65 (DV1), AV66 (DV2), and AV68 are opened and closed. Note that in this embodiment, the setting for circulating the inert gas in the transfer chamber 102 is executed.

In addition, when the "SET" button 518 is pressed and a "Return" button (not shown) on the screen is pressed, the screen is returned to an original operation screen.

Figure 5:
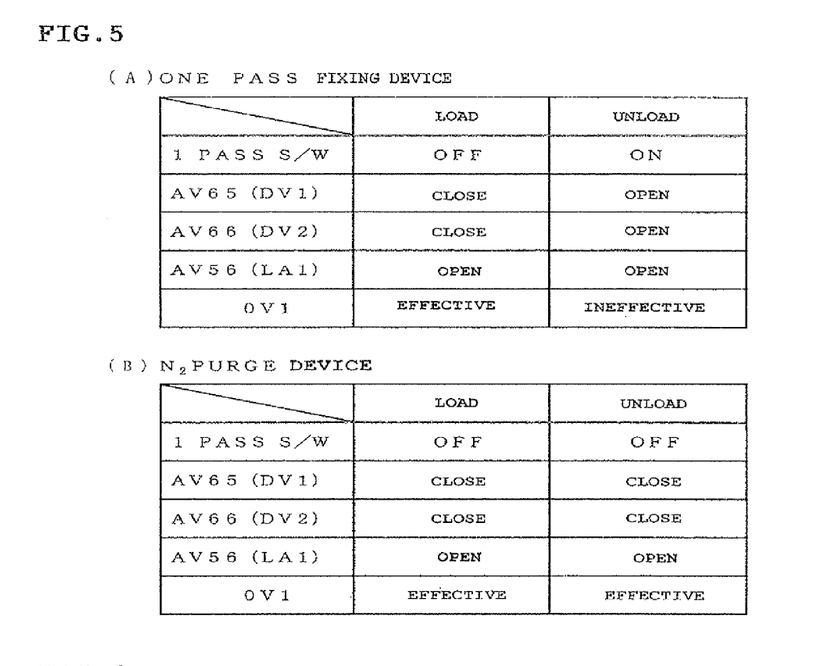
FIG. 5 is a view of an example of open/close setting of an open/close valve during loading and unloading of a boat or a wafer, according to an embodiment of the present invention.

FIG. 5 shows a display example for displaying on the operation screen a set screen for setting effective/non-effective of the opening and closing of the open/close valve AV65 (DV1), open/close valve AV66 (DV2), open/close valve AV56 (LA1), and detected values of the oxygen concentration sensor.

Specifically, this is a screen for performing a switch setting between an $N_2$ purge mode of FIG. 3(A) and 1 pass mode of FIG. 3(B). As described above, the setting may be performed by using a valve setting screen shown in FIG. 7. In addition, screen files shown in FIG. 5(A) and FIG. 5(B) may be stored in a hard disc 306 as a set table.

As shown in FIG. 5, the setting is divided by unload/load.

Here, the load/unload means the load/unload of the boat 217 holding the wafer 200.

As shown in FIG. 5(A), when 1PASS S/W (switch) is turned ON, the open/close valve AV65 (DV1) of the intake duct 300 is set to be Open, and the open/close valve AV56 (LA1) of the purge gas inlet tube 302a is set to be Open, and the open/close valve AV66 (DV2) of the exhaust duct 312 is set to be open.

Therefore, during unloading, organic matters are entirely exhausted before adhering to the wafer 200, by the inert gas introduced to the transfer chamber 102 from the purge gas inlet tube 302a, such as nitrogen gas and the atmospheric air from the intake tube 303. Therefore, it is possible to prevent the adhesion of the organic matters to the surface of the wafer 200.

Also, in this case, the oxygen concentration of the transfer chamber 102 is increased more than a monitor value of the oxygen concentration by introducing the atmospheric air, allowing a prescribed time to be elapsed. However, as shown in FIG. 5, monitor by the oxygen concentration sensor OV1 is made ineffective, thus not allowing the aforementioned problem to occur.

Also, under operation by 1PASS S/W function, adhesion of the organic matters to the wafer 200 is prevented, thus preventing a local distortion of crystal lattice and non-uniformity of an in-surface film thickness in the film deposition processing thereafter. Therefore, it is not necessary to execute cleaning of the wafer 200.

After substrate processing (for example, oxidation processing), the film, deposition processing is applied to the wafer 200 by another processing apparatus, thus depositing a $Si_3N_4$ film on a surface to be processed.

Here, when a processing temperature generated by the organic matters from wiring of the processing chamber 202 is included in conditions to turn ON the 1PASS S/W, a consumption of the inert gas can be reduced, because the 1PASS S/W is turned OFF at the lower processing temperature.

Note that when the 1PASS S/W (switch) is turned ON, the flow rate of the inert gas supplied form the purge gas inlet tube 302a is preferably set to be 800 SLM or more.

Meanwhile, when the 1PASS S/W (switch) is turned OFF, the open/close valve AV65 (DV1) of the intake tube 303 is set to be close, and the open/close valve AV56 (LA1) of the purge gas inlet tube 302a is set to be open, and the open/close valve AV66 (DV2) of the exhaust duct 312 is set to be close. In addition, the detection value of the oxygen concentration sensor OV1 is made effective.

Therefore, during loading, purge by introducing the inert gas is executed based on the detection value of the oxygen concentration sensor OV1 and the monitor value of the oxygen concentration of the transfer chamber 102, and the atmosphere of the transfer chamber is suitably discharged from a bypass line of the exhaust duct 312.

In addition, during loading, the organic matter is not generated in the transfer chamber 102, and therefore in the above-described case, the oxygen concentration in the transfer chamber 102 is maintained to the monitor value such as 20 ppm or less by a suitable amount of inert gas.

Note that in this case, the flow rate of the inert gas is decided within a range of 400 to 800 SLM or under.

In addition, when the oxygen concentration of the transfer chamber 102 reaches the monitor value, the open/close valve AV65 (DV1) of the intake tube 303 is set to be close, and the open/close valve AV68 of the intake duct 300 is set to be open, and in this state, circulation of the clean unit 134 in the transfer chamber is executed by the supply fan.

Thus, when the opening and closing of the open/close valves AV65 (DV1), AV66 (DV2), AV56 (LA1), and AV68 are set to execute a purge recipe, the organic matter generated in substrate processing is entirely, exhausted. Therefore, it is possible to prevent the adhesion of the organic matter to the surface of the wafer 200, and prevent the distortion of crystal lattice and non-uniformity of the in-surface film thickness during depositing the film thereafter. In addition, the cleaning step of the organic matter adhered to the wafer 200 can be omitted, and therefore productivity is improved.

Moreover, as shown in FIG. 5, by providing a unit for setting the open/close valve, versatility can be given to the apparatus. In addition, it may be so constituted that the button for turning ON/OFF the 1PASS S/W is provided on an operation screen, and by pressing this button during executing the process recipe, an operation mode is switched to the 1PASS S/W function. As a result, the operation mode can be switched to the 1PASS S/W function during unloading only, and therefore operation can be efficiently performed. It is matter of course that the 1PASS S/W function can also be canceled.

Next, explanation will be given for an example of the manufacturing method of the semiconductor device according to this embodiment.

The manufacturing method of the semiconductor device according to this embodiment of the present invention includes the steps of:

charging substrates into the boat 217, being a substrate holder, or supporting them by a substrate supporting tool of the processing chamber 202;

supplying a prescribed processing gas and processing the wafer 200 in a state of setting the inside of the processing chamber 200 in a prescribed temperature and maintaining a pressure therein in a specific range, and processing the wafer 200; and unloading the wafer 200 after processing from the processing chamber 202, in this order.

Then, in the step of unloading the wafer 200 after processing, namely, in the step of unloading the wafer 200 or the boat 217, atmosphere in the transfer chamber 102, namely, the clean air 133 containing the inert gas is exhausted in a set direction (1 PASS), and the adhesion of the organic matter to the wafer 200 is prevented.

Thereafter, the substrate processing (such as film deposition processing) is executed by another processing apparatus.

When such a method is executed, the organic matter generated during unloading is entirely exhausted, and the adhesion of the organic matter to the wafer 200 can be prevented. Accordingly, when the film deposition is executed after processing the substrate, the local distortion of crystal lattice and non-uniformity of the in-surface film thickness can be prevented.

Note that in this embodiment, explanation has been given for setting the opening and closing of the open/close valves AV65 (DV1), AV66 (DV2), AV56 (LA1), based on ON and OFF of the 1PASS S/W (switch). However, it may also be constituted so that the purge recipe when the 1PASS S/W (switch) referenced in unloading is turned ON, and the purge recipe when the 1PASS S/W (switch) referenced in loading is turned OFF, are prepared, then during loading/unloading the process recipe, these recipes are executed respectively, and the opening and closing of each open/close valve AV65 (DV1), AV66 (DV2) AV56 (LA1) are controlled as described above, to thereby prevent the adhesion of the organic matter to the wafer 200. In addition, the purge recipe prepared as described above may be assembled into the process recipe.

In addition, similarly, the ON/OFF button of the 1PASS S/W (switch) is provided on the operation screen, and by button operation on the operation screen, the purge recipe for turning ON the 1PASS S/W (switch) and the purge recipe for turning OFF the S/W (switch) referenced during loading can be selected, and by a manual operation, with the 1PASS S/W (switch) turned ON for unloading and the 1PASS S/W (switch) turned OFF for loading, the contamination of the wafer 200 by the organic matter is prevented.

Next, the operation of the processing apparatus according to this embodiment will be explained, with reference to FIG. 1 and FIG. 2.

When the pod 110 is supplied to the load port 114 by an in-step transport truck including AGV and OHT, the pod loading/unloading port 112 is opened by the front shutter 113, and the pod 110 on the load port 114 is loaded into the casing 111 from the pod loading/unloading port 112 by the pod transport device 118.

The loaded pod 110 is automatically transported to a designated rack board 117 of the rotary pod rack 105 by the pod transport device 118, temporarily stored therein, and thereafter transported to one pod opener 121 from the rack board 117 and transferred to the placement table 122 or directly transported to the pod opener 121 and transferred to the placement table 122.

At this time, the wafer charging/discharging port of the pod 110 is closed by the cap attachment/detachment mechanism 123, and the inert gas, being clean air, is circulated through the transfer chamber 102 and the transfer chamber 102 is filled with the inert gas by executing the recipe as will be described later. For example, by filling the transfer chamber 102 with nitrogen gas as the clean air 133, the oxygen concentration is set to be 20 ppm or less, which is much lower than the oxygen concentration of inside (atmospheric air) of the casing 111.

The pod 110 placed on the placement table 122 is pressed against an opening edge portion of the wafer loading/unloading port 120 on the front face wall 119a of the sub-casing 119, and its cap is removed by the cap attachment/detachment mechanism 123, and the wafer charging/discharging port of the pod 110 is opened.

When the pod 110 is opened by the pod opener 121, the wafer 200 is picked up through the wafer charging/discharging port by the tweezer 125c of the wafer transfer device 125a, and after the wafer 200 is aligned by the notch aligner, the wafer 200 is loaded into the standby part 126 behind the transfer chamber 102, and charged into the boat 217. After the wafer 200 is transferred to the boat 217, the wafer transfer device 125a returns to the pod 110 and the next wafer 200 is charged into the boat 217.

Meanwhile, another pod 110 is transported and transferred by the pod transport device 118 to the other (lower stage or upper stage) pod opener 121 during charging work of the wafer 200 into the boat 217 by the wafer transfer mechanism 125 in one (upper stage or lower stage) pod opener 121, and an opening work of the pod 110 by the pod opener 121 is simultaneously progressed.

When previously designated number of wafers 200 are charged into the boat 217, the furnace port of the reactor 201 closed by the furnace port shutter 147 is opened by opening operation of the furnace port shutter 147. Subsequently, the boat 217 holding a wafer 200 group is loaded into the processing chamber by elevating the seal cap 129 by the boat elevator 115.

After loading, by heating the heater according to a specific value of the recipe and by exhausting the atmosphere in the processing chamber of the vacuum pump (not shown), being a pressure reducing exhaust device, the inside of the processing chamber is maintained to the temperature and the pressure suitable for processing the substrate. Thereafter, the processing gas is supplied to the processing chamber 202.

When the processing gas is an oxide gas, by the reaction between the oxide gas and the surface of the wafer 200, the oxide film is formed on the surface of the wafer 200 to be processed. When the processing gas is a film deposition gas, the film is formed on the surface of the wafer 200 to be processed.

When the processing is finished, unloading of the boat 217 is executed by lowering the boat elevator 115.

At this time, according to the recipe, the 1PASS S/W (switch) is turned ON, and the open/close valve AV65 (DV1) of the intake tube 303 and the open/close valve AV56 (LA1) of the purge gas inlet tube 302a are set to be open, and the open/close valve AV66 (DV2) of the exhaust duct 312 is set to be open, so that the organic matter is entirely exhausted before adhering to the wafer 200, by the inert gas (such as nitrogen gas) introduced into the transfer chamber 102 from the purge gas inlet tube 302a and the atmospheric air introduced from the intake tube 303. Thus, the adhesion of the organic matter to the surface of the wafer 200 is prevented.

After processing, the wafer 200 and the pod 110 are discharged to the outside of the casing 111, in an opposite way to the aforementioned procedure, excluding the aligning step of the wafer 200 by means of the notch aligner 135.

Figure 8:
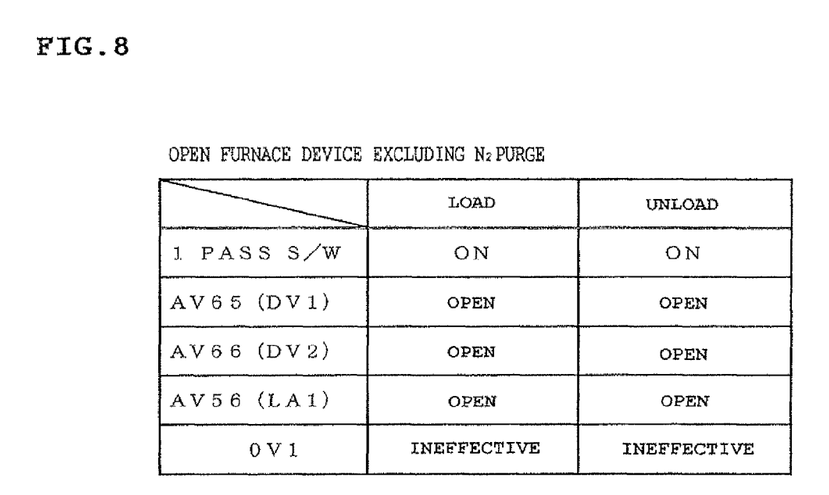
FIG. 8 is a view showing an example of open/close setting of the open/close valve during loading and unloading of the boat or the wafer, according to an embodiment of the present invention.

Other embodiments according to the present invention are also explained hereunder. When the 1Pass function is used even in a case that the transfer chamber of the present invention serves as a standby chamber not having air-tightness, organic contamination of the substrate can be reduced. FIG. 8 shows an example of a set screen at this time. In this case, in the standby chamber according to this embodiment, even if there is oxygen (even if a natural oxide film is adhered), $N_2$ purge is not required, thus making it possible to execute the 1Pass function during loading as well as during unloading.

Preferred aspects of the present invention will be additionally described hereunder.

<Aspect 1>

A substrate processing apparatus is provided, including a controller that performs control so that a transfer chamber connected to a processing chamber for processing a substrate is purged by inert gas, the controller having a function of circulating the inert gas through the transfer chamber, and a function of exhausting the inert gas in the transfer chamber in a set direction.

<Aspect 2>

The substrate processing apparatus is provided, having a plurality of recipes for purging the transfer chamber, with each of the function executed by selecting the recipe.

<Aspect 3>

The substrate processing apparatus is provided, wherein the function of exhausting the inert gas in a set direction and the function of circulating the inert gas can be switched by an operation screen.

<Aspect 4>

The substrate processing apparatus is provided, wherein a switching unit on an operation screen is pressed, during executing the recipe for purging the transfer chamber by the inert gas.

<Aspect 5>

A manufacturing method of a semiconductor device is provided, including the steps of:

inserting a substrate into a furnace and supporting it by a substrate holding tool;

processing the substrate in the furnace; and unloading the substrate after processing from the furnace, wherein in the step of unloading the substrate from the furnace, inert gas in the transfer chamber is exhausted in a set direction, and in the step of inserting the substrate holding tool into the furnace, the inert gas in the transfer chamber is circulated.

In the explanation of this embodiment, a case of applying the present invention to a vertical type processing apparatus has been explained. However, the present invention can also be applied to a horizontal type processing apparatus, and also can be applied to a sheet feeding apparatus.

Further, the processing apparatus according to the present invention can be applied to the substrate to be subjected to CVD, oxidation, and annealing processing, and various kinds of substrates such as quartz, liquid crystal, and semiconductor can be objects to be processed.

In addition, it may be so constituted that the inert gas inlet tube different from the exhaust duct 312 is connected to each pod 110, and by providing the open/close valves and replacing the atmosphere in each pod 110 with inert gas, natural oxidation of the substrate in each pod 110 is prevented.

Further, two or more purge systems including the open/close valve, mass flow controller, and purge gas inlet tube may be provided, for securing the flow rate and improving responsibility.

Thus, according to the present invention, various modifications are possible, and it is matter of course that the modified invention is also included in the present invention.

What is claimed is:

1. A substrate processing apparatus comprising:
   a processing chamber for processing a substrate;
   a transfer chamber connected to the processing chamber;
   an exhaust duct including (1) a first inlet port provided on a bottom of the transfer chamber, and (2) a first exhaust port connected to a gas discharge tube that discharges atmosphere from the processing chamber; and
   an intake duct including (1) a second inlet port that introduces the gas into the transfer chamber, (2) a blow out port that blows out the gas from the intake duct, and (3) a second exhaust port provided at the bottom of the transfer chamber,
   a controller that performs control so that the transfer chamber is purged by gas, the controller including a switching unit that switches between a first function of controlling an operation of the exhaust duct and an operation of the intake duct so that the gas in the transfer chamber is exhausted in a set direction, and a second function of controlling the operation of the exhaust duct and the operation of the intake duct so that the gas is circulated through the transfer chamber in an inert gas atmosphere.

2. The substrate processing apparatus of claim 1, further comprising:
   an operation screen, wherein
   the switching unit is configured to select between the first function and the second function on the operation screen during unloading of a boat or wafer.

3. The substrate processing apparatus of claim 2, wherein the switching unit is configured to switch between the first function and the second function on the operation screen while executing a recipe for purging the transfer chamber by inert gas or a process recipe for processing the substrate.

4. The substrate processing apparatus of claim 2, wherein the switching unit is configured to switch between a first recipe having the first function and a second recipe having the second function on the operation screen.

5. The substrate processing apparatus of claim 4, wherein the switching unit is further configured to allow the controller to execute the first recipe or the second recipe in parallel to a process recipe for processing the substrate.

6. The substrate processing apparatus of claim 4, wherein the switching unit is further configured to allow the controller to execute the first recipe or the second recipe as a part of a process recipe for processing the substrate.

7. A substrate processing apparatus comprising:
   a processing chamber for processing a substrate;
   a transfer chamber connected to the processing chamber and including
      an exhaust duct including an exhaust tube having an exhaust valve, and an oxygen concentration sensor, the exhaust tube configured to exhaust atmosphere and processed gas from the processing chamber,
      an intake duct configured to supply at least one gas selected from the group consisting of cleaned atmospheric air and inert gas, the intake duct having an intake valve, and
      a purge gas inlet tube inserted into the intake duct having a purge gas inlet valve; and
   a controller that performs control so that the transfer chamber is purged by the gas, the controller including a switching unit configured to switch between (i) a first function of exhausting the gas in the transfer chamber in a direction, and (ii) a second function of circulating the inert gas within the transfer chamber, by controlling a plurality of operation states of the transfer chamber including an open/closed state of the exhaust valve, an open/closed state of the purge gas inlet valve, an open/closed state of the intake valve, and an effective/non-effective state of the oxygen concentration sensor.

8. The substrate processing apparatus of claim 7, wherein the switching unit is configured to switch the first function and the second function while executing a purging recipe for purging the transfer chamber by inert gas or while executing a processing recipe for processing the substrate.

9. The substrate processing apparatus of claim 7, wherein the switching unit is configured to select the first function when the intake valve is set to be open, the exhaust valve is set to be open, the purge gas inlet valve is set to be open, and the oxygen concentration sensor is set to be non-effective, and is configured to select the second function when the intake valve is set to be closed, the exhaust valve is set to be closed, the purge gas inlet valve is set to be open, and the oxygen concentration sensor is set to be effective.

* * * * *